(12) United States Patent
Kim

(10) Patent No.: US 11,742,255 B2
(45) Date of Patent: *Aug. 29, 2023

(54) SILICON HEAT-DISSIPATION PACKAGE FOR COMPACT ELECTRONIC DEVICES

(71) Applicant: Gerald Ho Kim, Ontario, CA (US)

(72) Inventor: Gerald Ho Kim, Ontario, CA (US)

(*) Notice: Subject to any disclaimer, the term of this patent is extended or adjusted under 35 U.S.C. 154(b) by 214 days.

This patent is subject to a terminal disclaimer.

(21) Appl. No.: 17/128,748

(22) Filed: Dec. 21, 2020

(65) Prior Publication Data

US 2021/0225726 A1 Jul. 22, 2021

Related U.S. Application Data

(63) Continuation of application No. 16/226,268, filed on Dec. 19, 2018, now Pat. No. 10,903,134, which is a
(Continued)

(51) Int. Cl.
*H01L 23/367* (2006.01)
*H01L 31/0203* (2014.01)
(Continued)

(52) U.S. Cl.
CPC ...... *H01L 23/3672* (2013.01); *H01L 21/4803* (2013.01); *H01L 21/4882* (2013.01); *H01L 23/043* (2013.01); *H01L 23/051* (2013.01); *H01L 23/3675* (2013.01); *H01L 23/3738* (2013.01); *H01L 31/0203* (2013.01); *H01L 31/02325* (2013.01); *H01S 5/02469* (2013.01); H01L 31/024 (2013.01); H01L 31/02327 (2013.01); H01L 33/483 (2013.01); H01L 33/58 (2013.01); H01L 33/641 (2013.01); H01L 33/642 (2013.01); H01L 2924/0002 (2013.01);
(Continued)

(58) Field of Classification Search
CPC ............ H01L 23/3672; H01L 31/0203; H01L 31/024; H01L 33/483; H01L 2933/0075
See application file for complete search history.

(56) References Cited

U.S. PATENT DOCUMENTS 6,191,944 B1* 2/2001 Hammel ............ H01L 23/3675
174/16.3
6,777,263 B1* 8/2004 Gan ................... B81C 1/00269
438/455
(Continued)

*Primary Examiner* — Mark W Tornow
*Assistant Examiner* — Abbigale A Boyle
(74) *Attorney, Agent, or Firm* — Han IP PLLC; Andy M. Han

(57) ABSTRACT

Embodiments of a silicon heat-dissipation package for compact electronic devices are described. In one aspect, a device includes first and second silicon cover plates. The first silicon cover plate has a first primary side and a second primary side opposite the first primary side thereof. The second silicon cover plate has a first primary side and a second primary side opposite the first primary side thereof. The first primary side of the second silicon cover plate includes an indentation configured to accommodate an electronic device therein. The first primary side of the second silicon cover plate is configured to mate with the second primary side of the first silicon cover plate when the first silicon cover plate and the second silicon cover plate are joined together with the electronic device sandwiched therebetween.

7 Claims, 7 Drawing Sheets

Related U.S. Application Data continuation of application No. 15/410,620, filed on Jan. 19, 2017, now abandoned, which is a continuation of application No. 14/507,779, filed on Oct. 6, 2014, now abandoned.

(60) Provisional application No. 61/887,426, filed on Oct. 6, 2013.

(51) Int. Cl.

| | | |
|---|---|---|
| *H01L 31/024* | (2014.01) | |
| *H01L 23/051* | (2006.01) | |
| *H01L 23/043* | (2006.01) | |
| *H01L 31/0232* | (2014.01) | |
| *H01L 21/48* | (2006.01) | |
| *H01L 23/373* | (2006.01) | |
| *H01S 5/024* | (2006.01) | |
| *H05K 1/02* | (2006.01) | |
| *H05K 1/03* | (2006.01) | |
| *H05K 1/14* | (2006.01) | |
| *H01L 33/48* | (2010.01) | |
| *H01L 33/58* | (2010.01) | |
| *H01L 33/64* | (2010.01) | |

(52) U.S. Cl.
CPC .... *H01L 2933/0075* (2013.01); *H05K 1/0203* (2013.01); *H05K 1/0274* (2013.01); *H05K 1/0306* (2013.01); *H05K 1/144* (2013.01); *H05K 2201/041* (2013.01); *H05K 2201/049* (2013.01); *H05K 2201/09036* (2013.01); *H05K 2201/09063* (2013.01); *H05K 2201/09827* (2013.01); *H05K 2201/10098* (2013.01); *H05K 2201/10106* (2013.01); *H05K 2201/10151* (2013.01); *H05K 2201/10174* (2013.01)

(56) References Cited

U.S. PATENT DOCUMENTS

| | | | |
|---|---|---|---|
| 2004/0086011 A1* | 5/2004 | Bhandarkar | G02B 6/4214 438/22 |
| 2005/0077458 A1* | 4/2005 | Ma | H01L 31/02325 257/E31.128 |
| 2007/0007641 A1* | 1/2007 | Lee | H01L 25/0657 257/691 |
| 2011/0149537 A1* | 6/2011 | Kurosawa | H01L 23/3675 361/760 |
| 2011/0272824 A1* | 11/2011 | Pagaila | H01L 29/0657 257/777 |
| 2012/0104623 A1* | 5/2012 | Pagaila | H01L 23/13 257/E21.503 |
| 2012/0195051 A1* | 8/2012 | Kim | H01L 33/641 362/326 |

* cited by examiner

SILICON HEAT-DISSIPATION PACKAGE FOR COMPACT ELECTRONIC DEVICES

CROSS REFERENCE TO RELATED PATENT APPLICATION

The present disclosure is part of a continuation of U.S. patent application Ser. No. 16/226,268, filed on 19 Dec. 2018, which is a continuation of U.S. patent application Ser. No. 15/410,620, filed on 19 Jan. 2017, which is a continuation of U.S. patent application Ser. No. 14/507,779, filed on 6 Oct. 2014 and claiming the priority benefit of U.S. Patent Application No. 61/887,426, filed on 6 Oct. 2013. Contents of the aforementioned applications are incorporated by reference in their entirety.

TECHNICAL FIELD

The present disclosure generally relates to the field of transfer of thermal energy and, more particularly, removal of thermal energy from compact heat-generating devices.

BACKGROUND

There are many applications, ranging from consumer electronics to telecommunications and the like, in which compact electronic devices capable of performing various tasks are packed in close proximity in a small form factor to serve various needs. Such electronic devices may include, for example, microprocessors, graphics processors, memory chips, global positioning system (GPS) chips, communications chips, laser diodes including edge-emitting lasers and vertical-cavity surface-emitting lasers (VCSELs), light-emitting diodes (LEDs), edge-emitting laser diodes, radio frequency (RF) chips, microwave chips, photodiodes, sensors, etc. Electronic devices inevitably generate thermal energy, or heat, in operation and thus are heat sources, or heat-generating devices, during operation as well as for a period of time after power off. As the number and complexity of the functionalities performed by electronic devices continue to increase, heat generated by any type of electronic devices as heat sources present technical challenges that need to be addressed. For one thing, performance, useful lifespan, or both, of an electronic device may be significantly impacted if the heat generated by the electronic device is not adequately dissipated or otherwise removed from the compact electronic device.

Metal heat sinks, lead frames and radiators, based on copper or aluminum for example, have been a dominant heat sink choice for electronics and photonics applications. However, as the form factor of compact electronic devices gets smaller it is impractical to build a small metal heat sink with a large surface area heat sink to efficiently dissipate heat from compact electronic devices.

SUMMARY

Various embodiments disclosed herein pertain to a technique, design, scheme, device and apparatus related to a silicon heat-dissipation package for compact electronic devices as heat-generating devices.

In one aspect, a device may include first and second silicon cover plates. The first silicon cover plate may have a first primary side and a second primary side opposite the first primary side thereof. The second silicon cover plate may have a first primary side and a second primary side opposite the first primary side thereof. The first primary side of the second silicon cover plate may include an indentation configured to accommodate an electronic device therein. The first primary side of the second silicon cover plate may be configured to mate with the second primary side of the first silicon cover plate when the first silicon cover plate and the second silicon cover plate are joined together with the electronic device sandwiched therebetween.

In at least some embodiments, the electronic device may be bonded to the second silicon cover plate by thermally-conductive epoxy or solder when the electronic device is accommodated in the indentation of the second silicon cover plate.

In at least some embodiments, the first silicon cover plate may include an opening communicatively connecting the first primary side and the second primary side of the first silicon cover plate. The opening may be aligned with the electronic device and exposing at least a portion of the electronic device when the first silicon cover plate and the second silicon cover plate are joined together with the electronic device sandwiched therebetween.

In at least some embodiments, the device may further include a collimation element disposed in the opening of the first silicon cover plate and over the electronic device when the first silicon cover plate and the second silicon cover plate are joined together with the electronic device sandwiched therebetween.

In at least some embodiments, the collimation element may include a lens made of glass, silicone, quartz, or polymer.

In at least some embodiments, the second primary side of the first silicon cover plate may include first and second metallic patterns deposited thereon and configured to electrically connect to first and second electrodes of the electronic device, respectively, when the first silicon cover plate and the second silicon cover plate are joined together with the electronic device sandwiched therebetween.

In at least some embodiments, the second silicon cover plate may further include first and second vias on first and second sides of the indentation, respectively. The first and the second vias may be filled with an electrically-conductive material and may correspond to the first and the second metallic patterns on the first silicon cover plate to electrically connect to the first and the second metallic patterns, respectively, when the first silicon cover plate and the second silicon cover plate are joined together with the electronic device sandwiched therebetween.

In at least some embodiments, the device may further include a first silicon heat sink having a first primary side and a second primary side opposite the first primary side thereof. The first primary side of the first silicon heat sink may be configured to mate with the second primary side of the second silicon cover plate when the first silicon heat sink and the second silicon cover plate are joined together.

In at least some embodiments, the first primary side of the first silicon heat sink may include first and second electrodes deposited thereon and corresponding to the first and the second vias of the second silicon cover plate to electrically connect to the electrically-conductive material in the first and the second vias when the first silicon heat sink and the second silicon cover plate are joined together.

In at least some embodiments, the second primary side of the second silicon cover plate may include third and fourth metallic patterns deposited thereon and configured to electrically connect to the first and the second electrodes of the first silicon heat sink, respectively, when the first silicon heat sink and the second silicon cover plate are joined together.

In at least some embodiments, the first electrode of the first silicon heat sink may extend toward a first distal end of the first silicon heat sink and includes one or more first protrusions configured to electrically connect to an external circuit board, and the second electrode of the first silicon heat sink may extend toward a second distal end of the first silicon heat sink opposite the first distal end and includes one or more second protrusions configured to electrically connect to the external circuit board.

In at least some embodiments, the second primary side of the first silicon heat sink may include a plurality of first grooves that form a plurality of first fins on the second primary side of the first silicon heat sink.

In at least some embodiments, the device may further include a second silicon heat sink having a first primary side and a second primary side opposite the first primary side thereof. The second primary side of the second silicon heat sink may be configured to mate with the first primary side of the first silicon cover plate when the second silicon heat sink and the first silicon cover plate are joined together.

In at least some embodiments, the first primary side of the second silicon heat sink may include a plurality of second grooves that form a plurality of second fins on the first primary side of the second silicon heat sink.

In at least some embodiments, the first primary side of the first silicon cover plate may include a metal layer deposited thereon and configured to bond the first silicon cover plate and the second silicon heat sink.

In another aspect, a device may include first and second silicon cover plates, and may also include first and second silicon heat sinks. The first silicon cover plate may include a first primary side and a second primary side opposite the first primary side thereof. The second silicon cover plate may include a first primary side and a second primary side opposite the first primary side thereof. The first primary side of the second silicon cover plate may include an indentation configured to accommodate an electronic device therein. The first primary side of the second silicon cover plate may be configured to mate with the second primary side of the first silicon cover plate when the first silicon cover plate and the second silicon cover plate are joined together with the electronic device sandwiched therebetween. The first silicon heat sink may include a first primary side and a second primary side opposite the first primary side thereof. The first primary side of the first silicon heat sink may be configured to mate with the second primary side of the second silicon cover plate when the first silicon heat sink and the second silicon cover plate are joined together. The second silicon heat sink may include a first primary side and a second primary side opposite the first primary side thereof. The second primary side of the second silicon heat sink may be configured to mate with the first primary side of the first silicon cover plate when the second silicon heat sink and the first silicon cover plate are joined together.

In at least some embodiments, the first silicon cover plate may include an opening communicatively connecting the first primary side and the second primary side of the first silicon cover plate. The opening may be aligned with the electronic device and exposing at least a portion of the electronic device when the first silicon cover plate and the second silicon cover plate are joined together with the electronic device sandwiched therebetween. The second silicon heat sink may include an opening communicatively connecting the first primary side and the second primary side of the second silicon heat sink and aligned with the opening on the first silicon cover plate. The device may further include a collimation element disposed in the opening of the first silicon cover plate and over the electronic device when the first silicon cover plate and the second silicon cover plate are joined together with the electronic device sandwiched therebetween.

In at least some embodiments, the second primary side of the first silicon cover plate may include first and second metallic patterns deposited thereon and configured to electrically connect to first and second electrodes of the electronic device, respectively, when the first silicon cover plate and the second silicon cover plate are joined together with the electronic device sandwiched therebetween. The second silicon cover plate may further include first and second vias on first and second sides of the indentation, respectively. The first and the second vias may be filled with an electrically-conductive material and corresponding to the first and the second metallic patterns on the first silicon cover plate to electrically connect to the first and the second metallic patterns, respectively, when the first silicon cover plate and the second silicon cover plate are joined together with the electronic device sandwiched therebetween. The first primary side of the first silicon heat sink may include first and second electrodes deposited thereon and corresponding to the first and the second vias of the second silicon cover plate to electrically connect to the electrically-conductive material in the first and the second vias when the first silicon heat sink and the second silicon cover plate are joined together. The second primary side of the second silicon cover plate may include third and fourth metallic patterns deposited thereon and configured to electrically connect to the first and the second electrodes of the first silicon heat sink, respectively, when the first silicon heat sink and the second silicon cover plate are joined together.

In at least some embodiments, the second primary side of the first silicon heat sink may include a plurality of first grooves that form a plurality of first fins on the second primary side of the first silicon heat sink. The first primary side of the second silicon heat sink may include a plurality of second grooves that form a plurality of second fins on the first primary side of the second silicon heat sink.

In at least some embodiments, the device may further include the electronic device accommodated in the indentation of the second silicon cover plate and sandwiched between the first and the second silicon cover plates. The electronic device may be at least partially configured to function as a light-emitting diode (LED), a vertical-cavity surface-emitting laser (VCSEL), an edge-emitting laser diode, a radio frequency (RF) chip, a microwave chip, a photodiode, or a sensor.

In one aspect, a method may include: forming features of one or more first silicon cover plates on a first silicon wafer; forming features of one or more second silicon cover plates on a second silicon wafer; forming features of one or more first silicon heat sinks on a third silicon wafer; forming features of one or more second silicon heat sinks on a fourth silicon wafer; joining the first, the second, the third, and the fourth silicon wafers into a stack of wafers with one or more electronic devices sandwiched between the first silicon wafer and the second silicon wafer; and dicing the stack of wafers to form one or more silicon heat-dissipation packages each of which having a respective one of the one or more electronic devices embedded therein. The first and the second wafers may be sandwiched between the third and the fourth wafers. The first wafer may be adjacent the fourth wafer. The second wafer may be adjacent the third wafer. The one or more first silicon cover plates, the one or more second silicon cover plates, the one or more first silicon heat sinks, and the one or more second silicon heat sinks may be aligned with each other. Each of the one or more electronic devices may be sandwiched between a respective one of the first silicon cover plates and a respective one of the second silicon cover plates.

In at least some embodiments, at least one of the one or more electronic devices comprises an LED, a VCSEL, an edge-emitting laser diode, an RF chip, a microwave chip, a photodiode, or a sensor.

In at least some embodiments, forming features of one or more first silicon cover plates on the first silicon wafer may include forming an opening on each of the one or more first silicon cover plates. The opening may communicatively connect a first primary side and a second primary side of the first silicon cover plate opposite the first primary side. The opening may be aligned with a respective one of the one or more electronic devices and may expose at least a portion of the respective electronic device.

In at least some embodiments, the method may further include disposing each of one or more collimation elements in the respective opening of a respective one of the one or more first silicon cover plates.

In at least some embodiments, at least one of the one or more collimation elements may include a lens made of glass, silicone, quartz, or polymer.

In at least some embodiments, forming features of one or more second silicon cover plates on the second silicon wafer may include forming an indentation on a primary side of each of the one or more second silicon cover plates. The indentation may be configured to accommodate a respective one of the electronic devices therein.

In at least some embodiments, forming features of one or more first silicon heat sinks on the third silicon wafer may include forming a plurality of first grooves that form a plurality of first fins on a primary side of each of the one or more first silicon heat sinks facing away from and not contacting a respective one of the one or more second silicon cover plates.

In at least some embodiments, forming features of one or more second silicon heat sinks on the fourth silicon wafer may include forming an opening on each of the one or more second silicon heat sinks. The opening may communicatively connect a first primary side and a second primary side of the second silicon heat sinks opposite the first primary side. The opening of each of the one or more second silicon heat sinks may be aligned with the opening of a respective one of the one or more first silicon cover plates.

In at least some embodiments, forming features of one or more second silicon heat sinks on the fourth silicon wafer may include forming a plurality of second grooves that form a plurality of second fins on a primary side of each of the one or more second silicon heat sinks facing away from and not contacting a respective one of the one or more first silicon cover plates.

In at least some embodiments, forming features of the one or more first silicon cover plates on the first silicon wafer, forming features of the one or more second silicon cover plates on the second silicon wafer, and forming features of the one or more first silicon heat sinks on the third silicon wafer may include forming electrically-conductive features on each of the one or more first silicon cover plates, each of the one or more second silicon cover plates, and each of the one or more first silicon heat sinks such that the respective electronic device in each of the one or more silicon heat-dissipation packages is configured to be powered by an external power source through the electrically-conductive features on the respective first silicon cover plate, the respective second silicon cover plate, and the respective first silicon heat sink.

In another aspect, a method may include: joining first, second, third, and fourth silicon wafers into a stack of wafers with one or more electronic devices sandwiched between the first silicon wafer and the second silicon wafer; and dicing the stack of wafers to form one or more silicon heat-dissipation packages each of which having a respective one of the one or more electronic devices embedded therein. The first and the second wafers may be sandwiched between the third and the fourth wafers. The first wafer may be adjacent the fourth wafer. The second wafer may be adjacent the third wafer.

In at least some embodiments, the method may further include: forming features of one or more first silicon cover plates on the first silicon wafer; forming features of one or more second silicon cover plates on the second silicon wafer; forming features of one or more first silicon heat sinks on the third silicon wafer; and forming features of one or more second silicon heat sinks on the fourth silicon wafer.

In at least some embodiments, the one or more first silicon cover plates, the one or more second silicon cover plates, the one or more first silicon heat sinks, and the one or more second silicon heat sinks may be aligned with each other. Each of the one or more electronic devices may be sandwiched between a respective one of the first silicon cover plates and a respective one of the second silicon cover plates.

In at least some embodiments, at least one of the one or more electronic devices comprises an LED, a VCSEL, an edge-emitting laser diode, an RF chip, a microwave chip, a photodiode, or a sensor.

In at least some embodiments, the first silicon wafer may include features of one or more first silicon cover plates thereon. The features may include an opening on each of the one or more first silicon cover plates. The opening may communicatively connect a first primary side and a second primary side of the first silicon cover plate opposite the first primary side. The opening may be aligned with a respective one of the one or more electronic devices and exposing at least a portion of the respective electronic device.

In at least some embodiments, the method may further include disposing each of one or more collimation elements in the respective opening of a respective one of the one or more first silicon cover plates.

In at least some embodiments, at least one of the one or more collimation elements may include a lens made of glass, silicone, quartz, or polymer.

In at least some embodiments, the second silicon wafer may include features of one or more second silicon cover plates thereon. The features may include an indentation on a primary side of each of the one or more second silicon cover plates. The indentation may be configured to accommodate a respective one of the electronic devices therein.

In at least some embodiments, the third silicon wafer may include features of one or more first silicon heat sinks thereon. The features may include a plurality of first grooves that form a plurality of first fins on a primary side of each of the one or more first silicon heat sinks facing away from and not contacting a respective one of the one or more second silicon cover plates.

In at least some embodiments, the fourth silicon wafer may include features of one or more second silicon heat sinks thereon. The features may include an opening on each of the one or more second silicon heat sinks. The opening may communicatively connect a first primary side and a second primary side of the second silicon heat sinks opposite the first primary side. The opening of each of the one or more second silicon heat sinks may be aligned with the opening of a respective one of the one or more first silicon cover plates.

In at least some embodiments, the fourth silicon wafer may include features of one or more second silicon heat sinks thereon. The features may include a plurality of second grooves that form a plurality of second fins on a primary side of each of the one or more second silicon heat sinks facing away from and not contacting a respective one of the one or more first silicon cover plates.

In at least some embodiments, forming features of the one or more first silicon cover plates on the first silicon wafer, forming features of the one or more second silicon cover plates on the second silicon wafer, and forming features of the one or more first silicon heat sinks on the third silicon wafer may include forming electrically-conductive features on each of the one or more first silicon cover plates, each of the one or more second silicon cover plates, and each of the one or more first silicon heat sinks such that the respective electronic device in each of the one or more silicon heat-dissipation packages is configured to be powered by an external power source through the electrically-conductive features on the respective first silicon cover plate, the respective second silicon cover plate, and the respective first silicon heat sink.

The proposed techniques are further described below in the detailed description section. This summary is not intended to identify essential features of the claimed subject matter, nor is it intended for use in determining the scope of the claimed subject matter.

BRIEF DESCRIPTION OF THE DRAWINGS

The accompanying drawings are included to provide a further understanding of the disclosure, and are incorporated in and constitute a part of the present disclosure. The drawings illustrate embodiments of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED EMBODIMENTS

Overview

Various embodiments disclosed herein pertain to a technique, design, scheme, device and apparatus related to a silicon heat-dissipation package for compact electronic devices as heat-generating devices. Different from conventional techniques for heat dissipation for compact heat-generating devices in which metal heat sinks are used, embodiments of the heat-dissipation package, or device, of the present disclosure are entirely or mostly made of silicon such as, for example, single-crystal silicon. For components of the silicon heat-dissipation package of the present disclosure that are made of silicon, detailed features such as air cooling fins may be precision-made using semiconductor fabrication processes. Accordingly, components of the silicon heat-dissipation package of the present disclosure may be mass produced with high precision with semiconductor fabrication processes such as, for example, processes used in fabricating micro-electro-mechanical-system (MEMS) devices.

Example Embodiments

Figure 1:
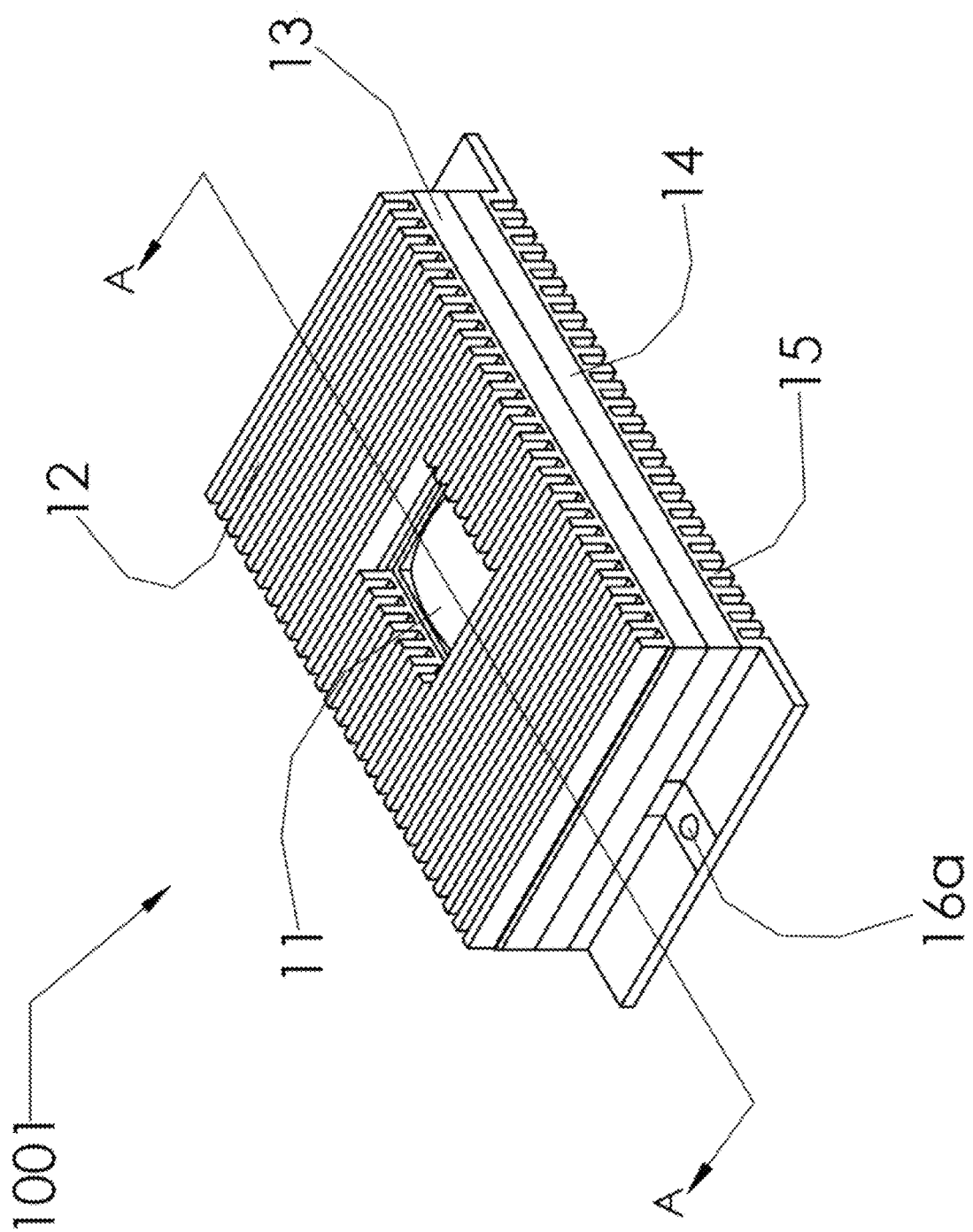
FIG. 1 is a perspective view of a silicon heat-dissipation package for a compact electronic device in accordance with an embodiment of the present disclosure.
Figure 2:
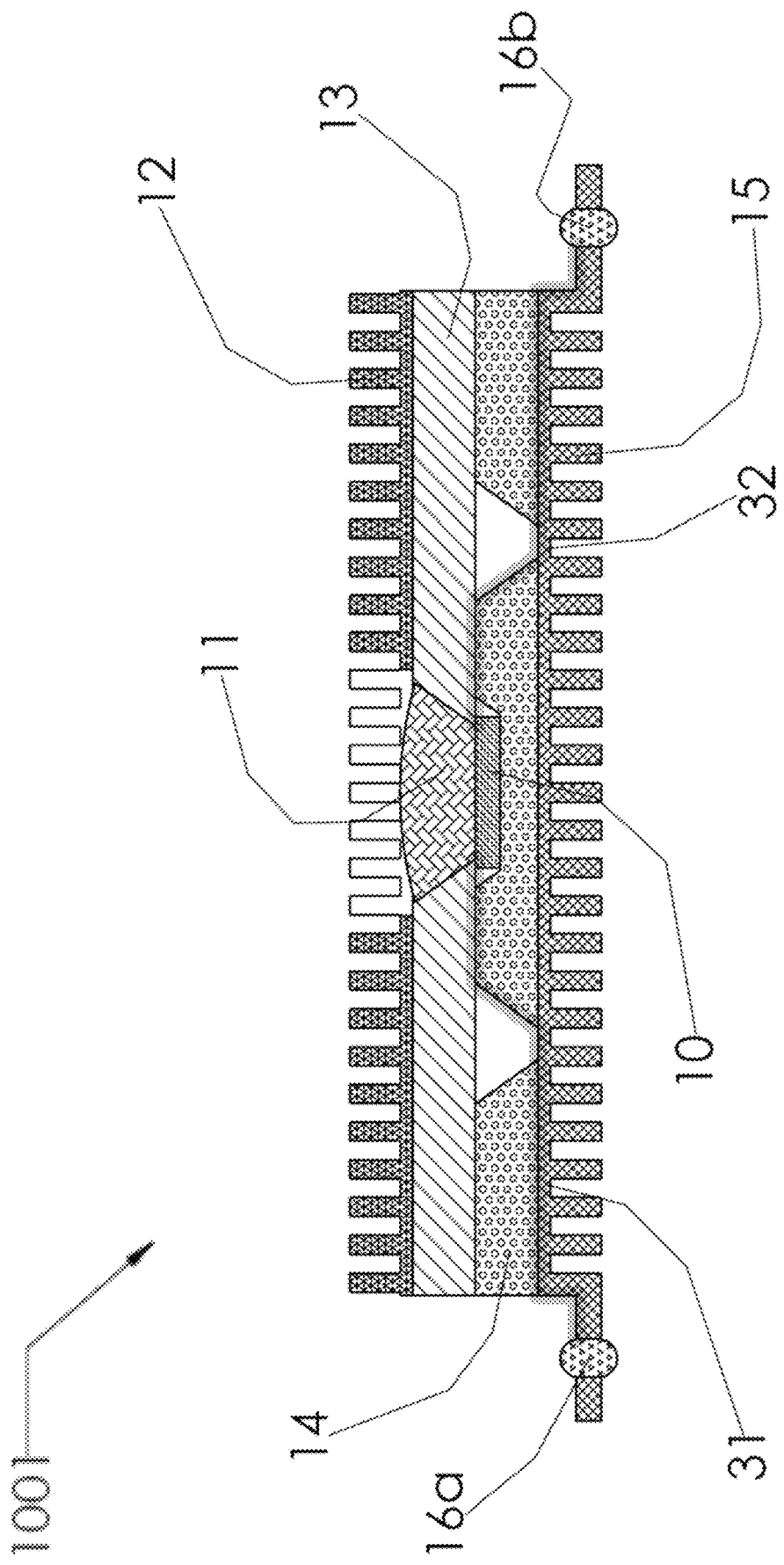
FIG. 2 is cross-sectional view of the silicon heat-dissipation package of FIG. 1.
Figure 3:
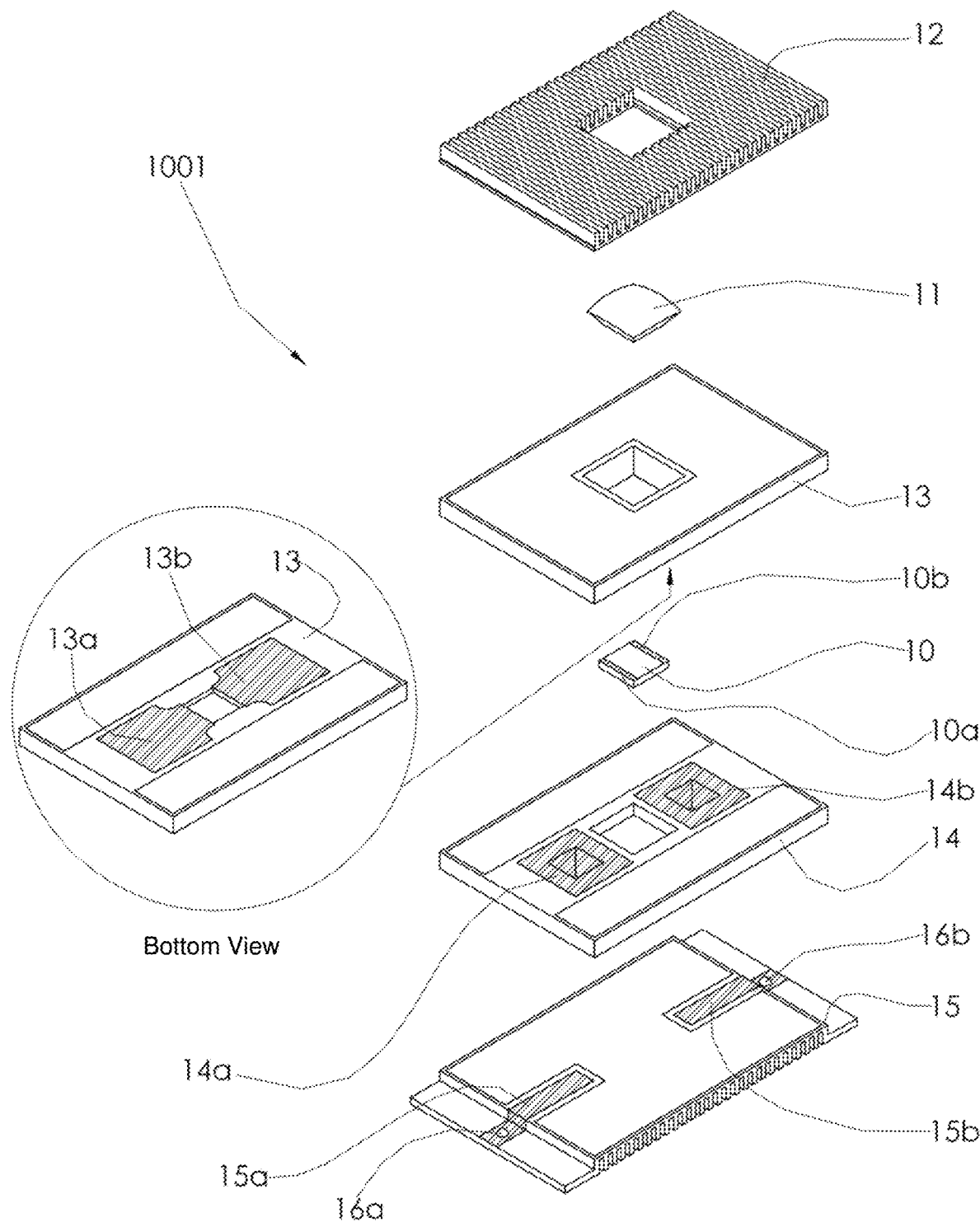
FIG. 3 is an exploded view of the silicon heat-dissipation package of FIG. 1.

FIG. 1 illustrates a silicon heat-dissipation package for a compact electronic device in accordance with an embodiment of the present disclosure. FIG. 2 is cross-sectional view of the silicon heat-dissipation package of FIG. 1. FIG. 3 is an exploded view of the silicon heat-dissipation package of FIG. 1. Detailed description of a select number of example embodiments are provided below with reference to FIGS. 1-3.

In one aspect, device 1001, a silicon heat-dissipation package, includes a first silicon cover plate 13 and a second silicon cover plate 14. The first silicon cover plate 13 has a first primary side (e.g., the side facing up in FIGS. 1-3) and a second primary side (e.g., the side facing down in FIGS. 1-3) opposite the first primary side thereof. Similarly, the second silicon cover plate 14 also has a first primary side (e.g., the side facing up in FIGS. 1-3) and a second primary side (e.g., the side facing down in FIGS. 1-3) opposite the first primary side thereof. The first primary side of the second silicon cover plate 14 includes an indentation that is configured to accommodate and receive an electronic device 10 therein. The first primary side of the second silicon cover plate 14 is configured to mate with the second primary side of the first silicon cover plate 13 when the first silicon cover plate 13 and the second silicon cover plate 14 are joined together with the electronic device 10 sandwiched therebetween. In at least some embodiments, the first silicon cover plate 13 and the second silicon cover plate 14 are joined together by, for example, metal soldering, epoxy boding, eutectic bonding, anodic bonding, or diffusion bonding.

In at least some embodiments, the electronic device 10 is bonded to the second silicon cover plate 14 by thermally-conductive epoxy or solder when the electronic device 10 is accommodated in the indentation of the second silicon cover plate 14. The electronic device 10 may be at least partially configured to function as, for example, an LED, a VCSEL, an edge-emitting laser diode, an RF chip, a microwave chip, a photodiode, or a sensor. In general, the electronic device 10 is electrically powered to perform its designed function(s) and, thus, generates heat during its normal operation.

In at least some embodiments, the first silicon cover plate 13 includes an opening communicatively connecting the first primary side and the second primary side of the first silicon cover plate 13, e.g., a through hole that traverses the thickness thereof. The opening is aligned with the electronic device 10 and, therefore, is configured to expose at least a portion of the electronic device 10 when the first silicon cover plate 13 and the second silicon cover plate 14 are joined together with the electronic device 10 sandwiched therebetween. This feature is particularly useful when the electronic device 10 is a type that emits or detects light, whether visible or invisible, such as an LED, a VCSEL, a photodiode, a sensor, an RF chip or a microwave chip, for example.

In at least some embodiments, a sidewall of the opening on the first silicon cover plate 13 is approximately 90.0° as measured from a horizontal plane that is parallel to the first primary side of the first silicon cover plate 13. In at least some other embodiments, the sidewall of the opening on the first silicon cover plate 13 is slanted or angled, in a cross-sectional view of the first silicon cover plate 13 as shown in FIG. 2, as measured from a horizontal plane that is parallel to the first primary side of the first silicon cover plate 13. That is, the angle as measured between the horizontal plane and the sidewall of the opening may be, for example, approximately 81.9°, 78.9°, 72.4°, 65.9°, 60.0°, 54.7°, 45.0°, 37.6°, 35.3°, 31.4°, 30.0°, 25.2°, 15.8° or 11.4°. The angle depends on the crystal plane of the silicon wafer used in fabricating the first silicon cover plate 13.

In at least some embodiments, the second primary side of the first silicon cover plate 13 includes an indentation such that, when the first silicon cover plate 13 and the second silicon cover plate 14 are joined together, a slit exists between the first silicon cover plate 13 and the second silicon cover plate 14. This feature is particularly useful when the electronic device 10 is an edge-emitting laser diode because a laser beam emitted by the electronic device 10, as an edge-emitting laser diode, may be emitted out of the silicon heat-dissipation package through the slit between the first silicon cover plate 13 and the second silicon cover plate 14. A collimating element may be disposed at or near an opening of the slit to collimate the laser beam emitted from the edge-emitting laser diode.

In at least some embodiments, the device 1001 further includes a collimation element 11 disposed in the opening of the first silicon cover plate 13 and over the electronic device 10 when the first silicon cover plate 13 and the second silicon cover plate 14 are joined together with the electronic device 10 sandwiched therebetween. When the sidewall of the opening on the first silicon cover plate 13 is angled, e.g., not vertical or 90° as measured from the horizontal plane (that is parallel to the first primary side of the first silicon cover plate 13) to the sidewall of the opening, the collimation element 11 is at least partially supported by the sidewall of the opening of the first silicon cover plate 13 as shown in FIG. 2.

In at least some embodiments, the collimation element 11 includes a lens which made of, for example, glass, silicone, quartz, or polymer.

In at least some embodiments, the second primary side of the first silicon cover plate 13 includes first and second metallic patterns 13a and 13b deposited thereon and configured to electrically connect to first and second electrodes 10a and 10b of the electronic device 10, respectively, when the first silicon cover plate 13 and the second silicon cover plate 14 are joined together with the electronic device 10 sandwiched therebetween.

In at least some embodiments, the second silicon cover plate 14 further includes first and second vias 14a and 14b on first and second sides (e.g., opposite sides) of the indentation, respectively. The first and the second vias 14a and 14b are filled with an electrically-conductive material, e.g., metal, and correspond to, e.g., aligned with, the first and the second metallic patterns 13a and 13b on the first silicon cover plate 13 to electrically connect to the first and the second metallic patterns 13a and 13b, respectively, when the first silicon cover plate 13 and the second silicon cover plate 14 are joined together with the electronic device 10 sandwiched therebetween.

In at least some embodiments, the device 1001 further includes a first silicon heat sink 15 that has a first primary side (e.g., the side facing up in FIGS. 1-3) and a second primary side (e.g., the side facing down in FIGS. 1-3) opposite the first primary side thereof. The first primary side of the first silicon heat sink 15 is configured to mate with the second primary side of the second silicon cover plate 14 when the first silicon heat sink 15 and the second silicon cover plate 14 are joined together. In at least some embodiments, the first silicon heat sink 15 and the second silicon cover plate 14 are joined together by, for example, metal soldering, epoxy boding, eutectic bonding, anodic bonding, or diffusion bonding.

In at least some embodiments, the first primary side of the first silicon heat sink 15 includes first and second electrodes 15a and 15b deposited thereon and corresponding to the first and the second vias 14a and 14b of the second silicon cover plate 14 to electrically connect to the electrically-conductive material in the first and the second vias 14a and 14b when the first silicon heat sink 15 and the second silicon cover plate 14 are joined together.

In at least some embodiments, the second primary side of the second silicon cover plate 14 includes third and fourth metallic patterns (not shown but similar to the first and second metallic patterns 13a and 13b on the second primary side of the first silicon cover plate 13) deposited thereon and configured to electrically connect to the first and the second electrodes 15a and 15b of the first silicon heat sink 15, respectively, when the first silicon heat sink 15 and the second silicon cover plate 14 are joined together.

In at least some embodiments, the first electrode 15a of the first silicon heat sink 15 extends toward a first distal end of the first silicon heat sink 15 and includes one or more first protrusions 16a, e.g., a ball bump, configured to electrically connect to an external circuit board such as, for example, a printed circuit board. Likewise, the second electrode 15b of the first silicon heat sink 15 extends toward a second distal end of the first silicon heat sink 15 opposite the first distal end and includes one or more second protrusions 16b, e.g., a ball bump, configured to electrically connect to the external circuit board.

In at least some embodiments, the second primary side of the first silicon heat sink 15 includes a plurality of first grooves that form a plurality of first fins on the second primary side of the first silicon heat sink 15. Thus, surface area of the first silicon heat sink 15 is increased multiple times with the grooves and fins on the second primary side thereof, and this feature advantageously aids heat dissipation by convection to the ambient air.

In at least some embodiments, the device 1001 further includes a second silicon heat sink 12 that has a first primary side (e.g., the side facing up in FIGS. 1-3) and a second primary side (e.g., the side facing down in FIGS. 1-3) opposite the first primary side thereof. The second primary side of the second silicon heat sink 12 is configured to mate with the first primary side of the first silicon cover plate 13 when the second silicon heat sink 12 and the first silicon cover plate 13 are joined together. In at least some embodiments, the first silicon cover plate 13 and the second silicon heat sink 12 are joined together by, for example, metal soldering, epoxy boding, eutectic bonding, anodic bonding, or diffusion bonding. The second silicon heat sink 12 includes an opening communicatively connecting the first primary side and the second primary side of the second silicon heat sink 12, e.g., a through hole that traverses the thickness thereof. The opening on the second silicon heat sink 12 is aligned with the opening on the first silicon cover plate 13 so as to expose at least a portion of the electronic device 10 to allow, for example, emission or detection of light by the electronic device 10. The size of the opening on the second silicon heat sink 12 may be the same as or different from the size of the opening on the first silicon cover plate 13, depending on the need in actual implementation.

In at least some embodiments, the first primary side of the second silicon heat sink 12 includes a plurality of second grooves that form a plurality of second fins on the first primary side of the second silicon heat sink 12. Thus, surface area of the second silicon heat sink 12 is increased multiple times with the grooves and fins on the second primary side thereof, and this feature advantageously aids heat dissipation by convection to the ambient air.

In at least some embodiments, the first primary side of the first silicon cover plate 13 includes a metal layer deposited thereon and configured to bond the first silicon cover plate 13 and the second silicon heat sink 12.

In another aspect, the device 1001 includes first and second silicon cover plates 13 and 14, and also includes first and second silicon heat sinks 15 and 12. The first silicon cover plate 13 includes a first primary side and a second primary side opposite the first primary side thereof. The second silicon cover plate 14 includes a first primary side and a second primary side opposite the first primary side thereof. The first primary side of the second silicon cover plate 14 includes an indentation configured to accommodate and receive the electronic device 10 therein. The first primary side of the second silicon cover plate 14 is configured to mate with the second primary side of the first silicon cover plate 13 when the first silicon cover plate 13 and the second silicon cover plate 14 are joined together with the electronic device 10 sandwiched therebetween. In at least some embodiments, the first silicon cover plate 13 and the second silicon cover plate 14 are joined together by, for example, metal soldering, epoxy boding, eutectic bonding, anodic bonding, or diffusion bonding. The first silicon heat sink 15 includes a first primary side and a second primary side opposite the first primary side thereof. The first primary side of the first silicon heat sink 15 is configured to mate with the second primary side of the second silicon cover plate 14 when the first silicon heat sink 15 and the second silicon cover plate 14 are joined together. In at least some embodiments, the first silicon heat sink 15 and the second silicon cover plate 14 are joined together by, for example, metal soldering, epoxy boding, eutectic bonding, anodic bonding, or diffusion bonding. The second silicon heat sink 12 includes a first primary side and a second primary side opposite the first primary side thereof. The second primary side of the second silicon heat sink 12 is configured to mate with the first primary side of the first silicon cover plate 13 when the second silicon heat sink 12 and the first silicon cover plate 13 are joined together. In at least some embodiments, the first silicon cover plate 13 and the second silicon heat sink 12 are joined together by, for example, metal soldering, epoxy boding, eutectic bonding, anodic bonding, or diffusion bonding.

In at least some embodiments, the first silicon cover plate 13 includes an opening communicatively connecting the first primary side and the second primary side of the first silicon cover plate 13. The opening is aligned with the electronic device 10 and exposes at least a portion of the electronic device 10 when the first silicon cover plate 13 and the second silicon cover plate 14 are joined together with the electronic device 10 sandwiched therebetween. The second silicon heat sink 12 includes an opening communicatively connecting the first primary side and the second primary side of the second silicon heat sink 12. The opening on the second silicon heat sink 12 is aligned with the opening on the first silicon cover plate 13. The size of the opening on the second silicon heat sink 12 may be the same as or different from the size of the opening on the first silicon cover plate 13, depending on the need in actual implementation. The device 1001 further includes a collimation element 11 disposed in the opening of the first silicon cover plate 13 and over the electronic device 10 when the first silicon cover plate 13 and the second silicon cover plate 14 are joined together with the electronic device 10 sandwiched therebetween. When the sidewall of the opening on the first silicon cover plate 13 is angled, e.g., not vertical or 90° as measured from the horizontal plane (that is parallel to the first primary side of the first silicon cover plate 13) to the sidewall of the opening, the collimation element 11 is at least partially supported by the sidewall of the opening of the first silicon cover plate 13 as shown in FIG. 2.

In at least some embodiments, a sidewall of the opening on the first silicon cover plate 13 is approximately 90.0° as measured from a horizontal plane that is parallel to the first primary side of the first silicon cover plate 13. In at least some other embodiments, the sidewall of the opening on the first silicon cover plate 13 is slanted or angled, in a cross-sectional view of the first silicon cover plate 13 as shown in FIG. 2, as measured from a horizontal plane that is parallel to the first primary side of the first silicon cover plate 13. That is, the angle as measured between the horizontal plane and the sidewall of the opening may be, for example, approximately 81.9°, 78.9°, 72.4°, 65.9°, 60.0°, 54.7°, 45.0°, 37.6°, 35.3°, 31.4°, 30.0°, 25.2°, 15.8° or 11.4°. The angle depends on the crystal plane of the silicon wafer used in fabricating the first silicon cover plate 13.

In at least some embodiments, the second primary side of the first silicon cover plate 13 includes first and second metallic patterns 13a and 13b deposited thereon and configured to electrically connect to first and second electrodes 10a and 10b of the electronic device 10, respectively, when the first silicon cover plate 13 and the second silicon cover plate 14 are joined together with the electronic device 10 sandwiched therebetween. The second silicon cover plate 14 further includes first and second vias 14a and 14b on first and second sides (e.g., opposite sides) of the indentation, respectively. The first and the second vias 14a and 14b are filled with an electrically-conductive material and correspond to the first and the second metallic patterns 13a and 13b on the first silicon cover plate 13 to electrically connect to the first and the second metallic patterns 13a and 13b, respectively, when the first silicon cover plate 13 and the second silicon cover plate 14 are joined together with the electronic device 10 sandwiched therebetween. The first primary side of the first silicon heat sink 15 includes first and second electrodes 15a and 15b deposited thereon and corresponding to the first and the second vias 14a and 14b of the second silicon cover plate 14 to electrically connect to the electrically-conductive material in the first and the second vias 14a and 14b when the first silicon heat sink 15 and the second silicon cover plate 14 are joined together. The second primary side of the second silicon cover plate 14 includes third and fourth metallic patterns (not shown) deposited thereon and configured to electrically connect to the first and the second electrodes 15a and 15b of the first silicon heat sink 15, respectively, when the first silicon heat sink 15 and the second silicon cover plate 14 are joined together.

In at least some embodiments, the second primary side of the first silicon heat sink 15 includes a plurality of first grooves that form a plurality of first fins on the second primary side of the first silicon heat sink 15. Similarly, the first primary side of the second silicon heat sink 12 includes a plurality of second grooves that form a plurality of second fins on the first primary side of the second silicon heat sink 12. Accordingly, surface areas of the first and the second silicon heat sinks 15 and 12 are increased multiple times with the grooves and fins on the second primary side thereof, and this feature advantageously aids heat dissipation by convection to the ambient air.

In at least some embodiments, the device 1001 further includes the electronic device 10 accommodated and received in the indentation of the second silicon cover plate 14 and sandwiched between the first and the second silicon cover plates 13 and 14. The electronic device 10 may be at least partially configured to function as an LED, a laser diode such as a VCSEL, an RF chip, a microwave chip, a photodiode, or a sensor.

In at least some embodiments, the second primary side of the first silicon cover plate 13 includes an indentation such that, when the first silicon cover plate 13 and the second silicon cover plate 14 are joined together, a slit exists between the first silicon cover plate 13 and the second silicon cover plate 14. This feature is particularly useful when the electronic device 10 is an edge-emitting laser diode because a laser beam emitted by the electronic device 10, as an edge-emitting laser diode, may be emitted out of the silicon heat-dissipation package through the slit between the first silicon cover plate 13 and the second silicon cover plate 14. A collimating element may be disposed at or near an opening of the slit to collimate the laser beam emitted from the edge-emitting laser diode.

A core concept of the silicon heat-dissipation package of the present disclosure is that the heat-generating compact electronic device 10 is sandwiched between the first silicon cover plate 13 and the second silicon cover plate 14 so that heat can be effectively and efficiently transferred from the electronic device 10 to the first silicon cover plate 13 and the second silicon cover plate 14, at least by thermal conduction due to direct contacts therebetween. The silicon heat-dissipation package may optionally include either or both of the first silicon heat sink 15 and the second silicon heat sink 12 to aid spreading the heat away from the electronic device 10 and into ambient air and/or a thermal ground, e.g., a casing of an apparatus in which the silicon heat-dissipation package is contained or an object to which the silicon heat-dissipation package is attached.

Therefore, various implementations of the silicon heat-dissipation package may have different numbers of components. For instance, in one implementation, the silicon heat-dissipation package may include the first and the second silicon cover plates 13 and 14. In another implementation, the silicon heat-dissipation package may include the first and the second silicon cover plates 13 and 14 as well as the first silicon heat sink 15. In yet another implementation, the silicon heat-dissipation package may include the first and the second silicon cover plates 13 and 14 as well as the second silicon heat sink 12. In still another implementation, the silicon heat-dissipation package may include the first and the second silicon cover plates 13 and 14 as well as the first and the second silicon heat sinks 15 and 12.

As another example, in some implementations, the electrodes 10a and 10b of the electronic device 10 may be on the side of the electronic device 10 facing and/or in contact with the second silicon cover plate 14. Accordingly, there would be no need to deposit the metallic patterns 13a and 13b on the second primary side of the first silicon cover plate 13 and, instead, there would be metallic patterns deposited on the first primary side of the second silicon cover plate 14 and extending from the first and the second vias 14a and 14b, respectively, to provide electrical connection from an external power source to the electronic device 10. Alternatively, in some implementations, the electrodes 10a and 10b of the electronic device 10 may be on different, e.g., opposite, sides of the electronic device 10. Accordingly, there would be metallic patterns deposited on both the second primary side of the first silicon cover plate 13 and the first primary side of the second silicon cover plate 14 to provide electrical connection from an external power source to the electronic device 10.

Embodiments of the silicon heat-dissipation package of described above embeds a single electronic device therein and, thus, may have an opening (i.e., through the first silicon cover plate and the second silicon heat sink) to expose at least a portion of the electronic device, e.g., for emission or detection purpose. In some implementations, however, a single silicon heat-dissipation package in accordance with the present disclosure may embed multiple electronic devices therein. Accordingly, depending on the function of the electronics devices, the silicon heat-dissipation package may include one or more openings to expose at least a portion of some or all of the multiple electronic devices embedded therein. That is, one or more of the multiple electronic devices embedded therein may need to be at least partially exposed, e.g., for emission or detection purpose, while one or more other ones of the multiple electronic devices embedded therein need not be exposed. As would be appreciated by those skilled in the art, the scope of the inventive concept of the present disclosure is not limited to and in fact extends beyond those examples illustrated and described herein.

Example Processes

Figure 4:
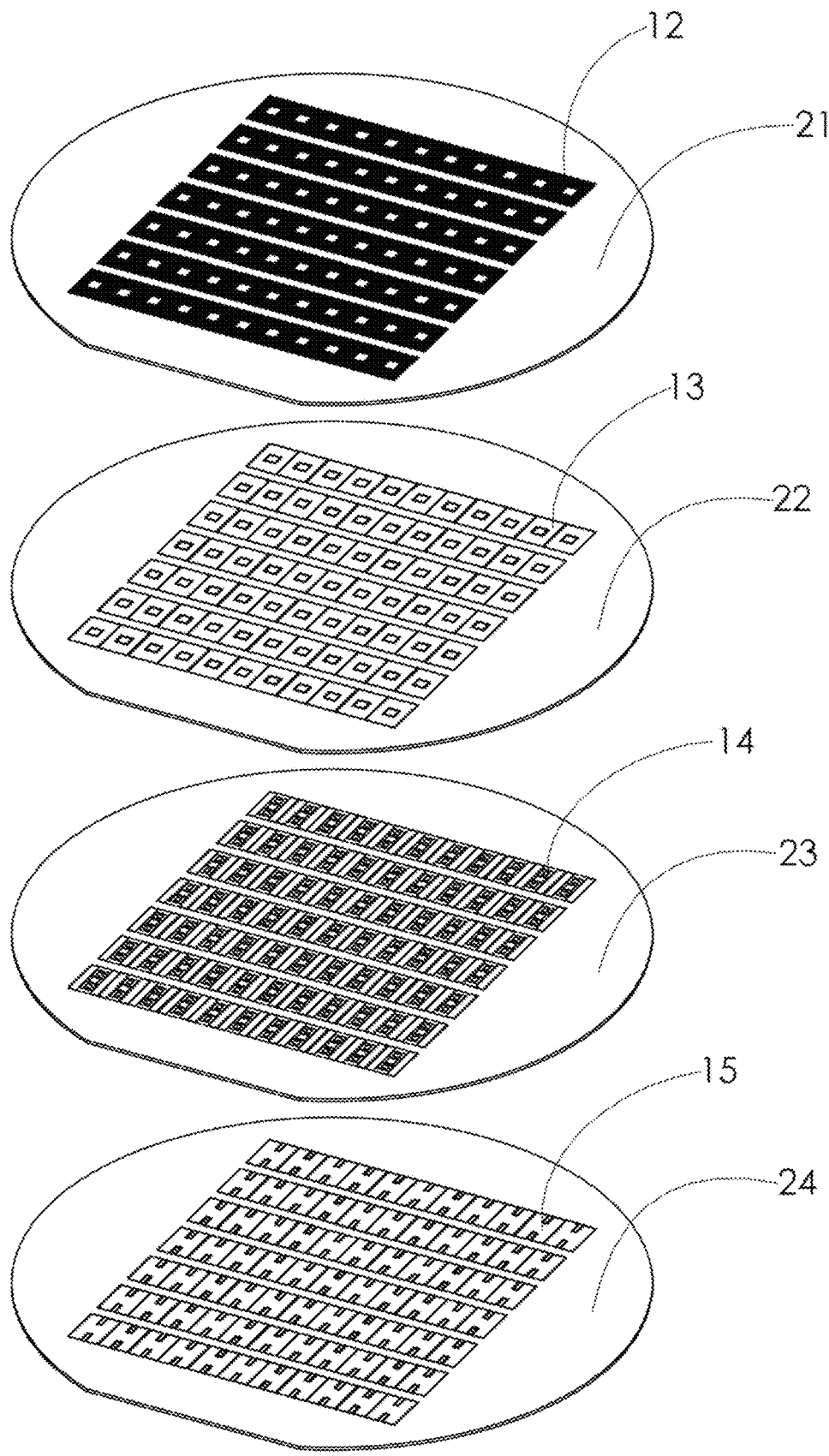
FIG. 4 is a perspective view of various silicon wafers that constitute various layers of the silicon heat-dissipation package of FIG. 1.
Figure 5:
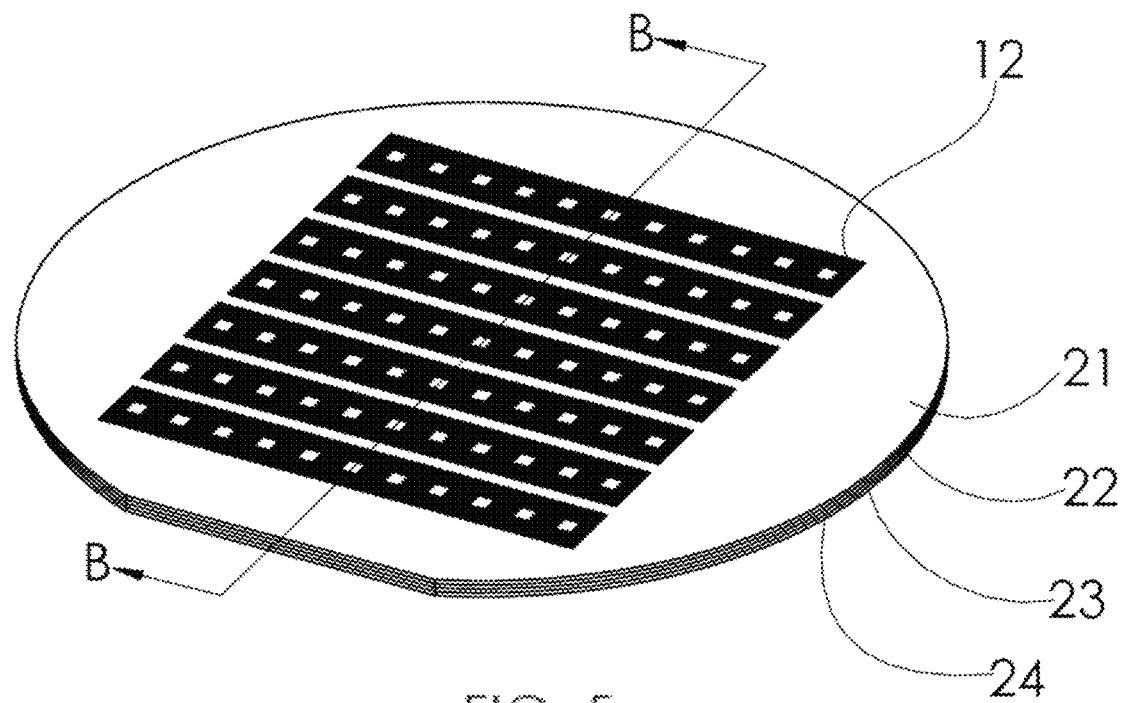
FIG. 5 is a perspective view of the various silicon wafers of FIG. 4 assembled in a stack in the fabrication process of the silicon heat-dissipation package of FIG. 1.
Figure 6:
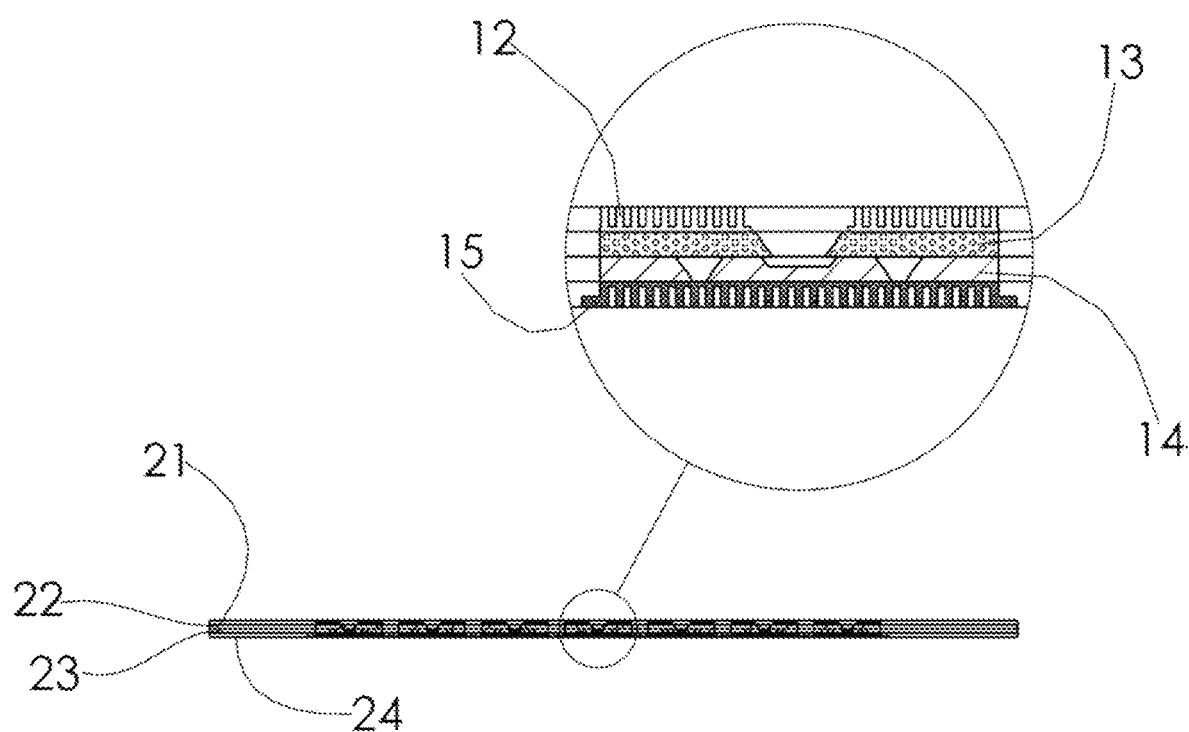
FIG. 6 is a cross-sectional view of the stack of silicon wafers of FIG. 5 along line BB.

FIG. 4 illustrates various silicon wafers that constitute various layers of the silicon heat-dissipation package of FIG. 1. FIG. 5 is a perspective view of the various silicon wafers of FIG. 4 assembled in a stack in the fabrication process of the silicon heat-dissipation package of FIG. 1. FIG. 6 is a cross-sectional view of the stack of silicon wafers of FIG. 5 along line BB. Detailed description of a select number of example embodiments are provided below with reference to FIGS. 4-6.

As shown in FIGS. 1-3, the silicon heat-dissipation package, or device 1001, comprises of multiple layers of silicon components. Each of these layers of silicon components may be a single piece of die of multiple dies cut from a respective silicon wafer. Accordingly, as shown in FIGS. 4-6, silicon wafers 21, 22, 23 and 24 are processed to produce components of the device 1001, namely the second silicon heat sink 12, the first silicon cover plate 13, the second silicon cover plate 14 and the first silicon heat sink 15. Each of the silicon wafers 21, 22, 23 and 24 is, for example, a wafer of single-crystal silicon. Silicon wafer 21 is processed to include features that, when the silicon wafer 21 is cut into multiple piece of dies, will provide multiple instances of the second silicon heat sink 12. Silicon wafer 22 is processed to include features that, when the silicon wafer 22 is cut into multiple piece of dies, will provide multiple instances of the first silicon cover plate 13. Silicon wafer 23 is processed to include features that, when the silicon wafer 23 is cut into multiple piece of dies, will provide multiple instances of the second silicon cover plate 14. Silicon wafer 24 is processed to include features that, when the silicon wafer 24 is cut into multiple piece of dies, will provide multiple instances of the first silicon heat sink 15.

In at least some embodiments, each of the silicon wafers 21, 22, 23 and 24 are processed first, e.g., through some or all of the steps of deposition, photolithography, dry and/or wet etch and chemical/mechanical polishing, so that features of the respective component of the device 1001 are fabricated onto each of the silicon wafers 21, 22, 23 and 24. Then, as shown in FIGS. 5 and 6, the silicon wafers 21, 22, 23 and 24 are stacked and joined together, with multiple instances of the electronic device 10 and the collimation element 11 respectively sandwiched therebetween, before cutting. The silicon wafers 21, 22, 23 and 24 are joined together by, for example, metal soldering, epoxy boding, eutectic bonding, anodic bonding, or diffusion bonding. When the stack of the processed silicon wafers 21, 22, 23 and 24 is cut into multiple pieces of stacked dies, each of the stacked dies constitutes a single instance of the device 1001, which is a silicon heat-dissipation device, with a respective electronic device 10 embedded therein.

In view of the above description with reference to FIGS. 4-6, the following description pertains to a select number of embodiments a fabrication process in accordance with the present disclosure.

Figure 7:
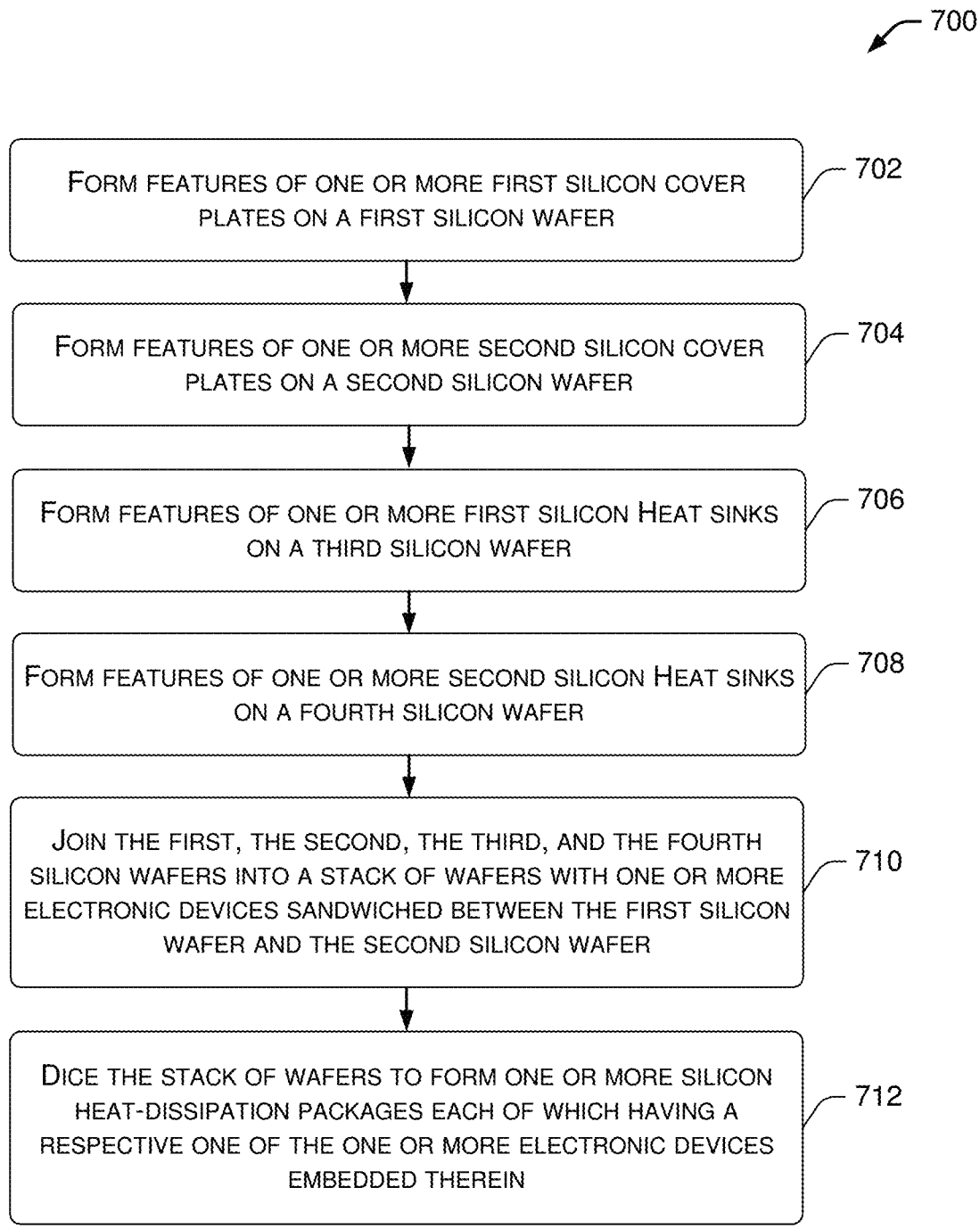
FIG. 7 is a flowchart of a fabrication process of one or more silicon heat-dissipation packages in accordance with an embodiment of the present disclosure.

FIG. 7 illustrates a fabrication process 700 of one or more silicon heat-dissipation packages in accordance with an embodiment of the present disclosure. Process 700 includes one or more operations, actions, or functions as illustrated by one or more of blocks 702, 704, 706, 708, 710 and 712. Process 700 may be implemented in fabricating one or more silicon heat-dissipation packages as shown in FIGS. 4-6. Although illustrated as discrete blocks, various blocks may be divided into additional blocks, combined into fewer blocks, or eliminated, depending on the desired implementation. Process 700 begins with operation 702.

At 702, process 700 may form features of one or more first silicon cover plates on a first silicon wafer.

At 704, process 700 may form features of one or more second silicon cover plates on a second silicon wafer.

At 706, process 700 may form features of one or more first silicon heat sinks on a third silicon wafer.

At 708, process 700 may form features of one or more second silicon heat sinks on a fourth silicon wafer.

At 710, process 700 may join the first, the second, the third, and the fourth silicon wafers into a stack of wafers with one or more electronic devices sandwiched between the first silicon wafer and the second silicon wafer. In at least some embodiments, the first, the second, the third, and the fourth silicon wafers are joined together by, for example, metal soldering, epoxy boding, eutectic bonding, anodic bonding, or diffusion bonding. In at least some embodiments, each of the first, the second, the third, and the fourth wafer is a wafer of single-crystal silicon.

At 712, process 700 may dice the stack of wafers to form one or more silicon heat-dissipation packages each of which having a respective one of the one or more electronic devices embedded therein.

In joining the first, the second, the third, and the fourth silicon wafers into a stack of wafers with one or more electronic devices sandwiched between the first silicon wafer and the second silicon wafer, process 700 may result in the following: the first and the second wafers being sandwiched between the third and the fourth wafers; the first wafer being adjacent the fourth wafer; the second wafer being adjacent the third wafer; the one or more first silicon cover plates, the one or more second silicon cover plates, the one or more first silicon heat sinks, and the one or more second silicon heat sinks being aligned with each other; and each of the one or more electronic devices being sandwiched between a respective one of the first silicon cover plates and a respective one of the second silicon cover plates.

In at least some embodiments, at least one of the one or more electronic devices comprises an LED, a laser diode such as a VCSEL, an RF chip, a microwave chip, a photodiode, or a sensor.

In at least some embodiments, in forming features of one or more first silicon cover plates on the first silicon wafer, process 700 may form an opening on each of the one or more first silicon cover plates. The opening may communicatively connect a first primary side and a second primary side of the first silicon cover plate opposite the first primary side. The opening may be aligned with a respective one of the one or more electronic devices and may expose at least a portion of the respective electronic device.

In at least some embodiments, process 700 may further include disposing each of one or more collimation elements in the respective opening of a respective one of the one or more first silicon cover plates.

In at least some embodiments, at least one of the one or more collimation elements may include a lens made of glass, silicone, quartz, or polymer.

In at least some embodiments, in forming features of one or more second silicon cover plates on the second silicon wafer, process 700 may form an indentation on a primary side of each of the one or more second silicon cover plates. The indentation may be configured to accommodate a respective one of the electronic devices therein.

In at least some embodiments, in forming features of one or more first silicon heat sinks on the third silicon wafer, process 700 may form a plurality of first grooves that form a plurality of first fins on a primary side of each of the one or more first silicon heat sinks facing away from and not contacting a respective one of the one or more second silicon cover plates.

In at least some embodiments, in forming features of one or more second silicon heat sinks on the fourth silicon wafer, process 700 may form an opening on each of the one or more second silicon heat sinks. The opening may communicatively connect a first primary side and a second primary side of the second silicon heat sinks opposite the first primary side. The opening of each of the one or more second silicon heat sinks may be aligned with the opening of a respective one of the one or more first silicon cover plates.

In at least some embodiments, in forming features of one or more second silicon heat sinks on the fourth silicon wafer, process 700 may form a plurality of second grooves that form a plurality of second fins on a primary side of each of the one or more second silicon heat sinks facing away from and not contacting a respective one of the one or more first silicon cover plates.

In at least some embodiments, in forming features of the one or more first silicon cover plates on the first silicon wafer, forming features of the one or more second silicon cover plates on the second silicon wafer, and forming features of the one or more first silicon heat sinks on the third silicon wafer, process 700 may form electrically-conductive features on each of the one or more first silicon cover plates, each of the one or more second silicon cover plates, and each of the one or more first silicon heat sinks such that the respective electronic device in each of the one or more silicon heat-dissipation packages is configured to be powered by an external power source through the electrically-conductive features on the respective first silicon cover plate, the respective second silicon cover plate, and the respective first silicon heat sink.

Figure 8:
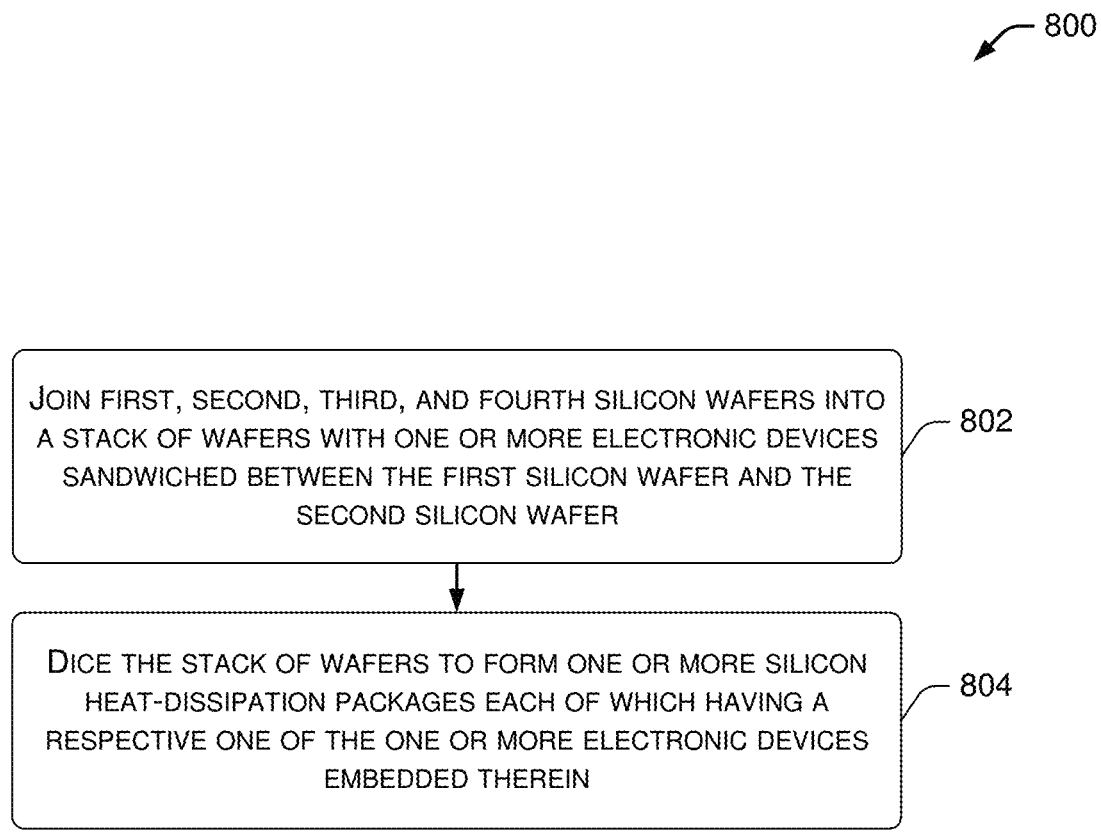
FIG. 8 is a flowchart of a fabrication process of one or more silicon heat-dissipation packages in accordance with another embodiment of the present disclosure.

FIG. 8 illustrates a fabrication process 800 of one or more silicon heat-dissipation packages in accordance with another embodiment of the present disclosure. Process 800 includes one or more operations, actions, or functions as illustrated by one or more of blocks 802 and 804. Process 800 may be implemented in fabricating one or more silicon heat-dissipation packages as shown in FIGS. 4-6. Although illustrated as discrete blocks, various blocks may be divided into additional blocks, combined into fewer blocks, or eliminated, depending on the desired implementation. Process 800 begins with operation 802.

At 802, process 800 may join first, second, third, and fourth silicon wafers into a stack of wafers with one or more electronic devices sandwiched between the first silicon wafer and the second silicon wafer. In at least some embodiments, the first, the second, the third, and the fourth silicon wafers are joined together by, for example, metal soldering, epoxy boding, eutectic bonding, anodic bonding, or diffusion bonding. In at least some embodiments, each of the first, the second, the third, and the fourth wafer is a wafer of single-crystal silicon.

At 804, process 800 may dice the stack of wafers to form one or more silicon heat-dissipation packages each of which having a respective one of the one or more electronic devices embedded therein. The first and the second wafers may be sandwiched between the third and the fourth wafers. The first wafer may be adjacent the fourth wafer. The second wafer may be adjacent the third wafer.

In at least some embodiments, process 800 may further include forming features of one or more first silicon cover plates on the first silicon wafer; forming features of one or more second silicon cover plates on the second silicon wafer; forming features of one or more first silicon heat sinks on the third silicon wafer; and forming features of one or more second silicon heat sinks on the fourth silicon wafer.

In at least some embodiments, the one or more first silicon cover plates, the one or more second silicon cover plates, the one or more first silicon heat sinks, and the one or more second silicon heat sinks may be aligned with each other. Each of the one or more electronic devices may be sandwiched between a respective one of the first silicon cover plates and a respective one of the second silicon cover plates.

In at least some embodiments, at least one of the one or more electronic devices comprises an LED, a laser diode such as a VCSEL, an RF chip, a microwave chip, a photodiode, or a sensor.

In at least some embodiments, the first silicon wafer may include features of one or more first silicon cover plates thereon. The features may include an opening on each of the one or more first silicon cover plates. The opening may communicatively connect a first primary side and a second primary side of the first silicon cover plate opposite the first primary side. The opening may be aligned with a respective one of the one or more electronic devices and exposing at least a portion of the respective electronic device.

In at least some embodiments, the method may further include disposing each of one or more collimation elements in the respective opening of a respective one of the one or more first silicon cover plates.

In at least some embodiments, at least one of the one or more collimation elements may include a lens made of glass, silicone, quartz, or polymer.

In at least some embodiments, the second silicon wafer may include features of one or more second silicon cover plates thereon. The features may include an indentation on a primary side of each of the one or more second silicon cover plates. The indentation may be configured to accommodate a respective one of the electronic devices therein.

In at least some embodiments, the third silicon wafer may include features of one or more first silicon heat sinks thereon. The features may include a plurality of first grooves that form a plurality of first fins on a primary side of each of the one or more first silicon heat sinks facing away from and not contacting a respective one of the one or more second silicon cover plates.

In at least some embodiments, the fourth silicon wafer may include features of one or more second silicon heat sinks thereon. The features may include an opening on each of the one or more second silicon heat sinks. The opening may communicatively connect a first primary side and a second primary side of the second silicon heat sinks opposite the first primary side. The opening of each of the one or more second silicon heat sinks may be aligned with the opening of a respective one of the one or more first silicon cover plates.

In at least some embodiments, the fourth silicon wafer may include features of one or more second silicon heat sinks thereon. The features may include a plurality of second grooves that form a plurality of second fins on a primary side of each of the one or more second silicon heat sinks facing away from and not contacting a respective one of the one or more first silicon cover plates.

In at least some embodiments, in forming features of the one or more first silicon cover plates on the first silicon wafer, forming features of the one or more second silicon cover plates on the second silicon wafer, and forming features of the one or more first silicon heat sinks on the third silicon wafer, process 800 may form electrically-conductive features on each of the one or more first silicon cover plates, each of the one or more second silicon cover plates, and each of the one or more first silicon heat sinks such that the respective electronic device in each of the one or more silicon heat-dissipation packages is configured to be powered by an external power source through the electrically-conductive features on the respective first silicon cover plate, the respective second silicon cover plate, and the respective first silicon heat sink.

Example Applications

Various embodiments of the silicon heat-dissipation package described herein, and any variations thereof, may be implemented in a wide variety of applications including, but not limited to, portable electronics applications. For example, a silicon heat-dissipation package as described herein may be used in a portable electronics apparatus such as a tablet computer (e.g., iPad by Apple of Cupertino, Calif.), hand-held mobile communication device (e.g., iPhone by Apple of Cupertino, Calif.), notebook/laptop computer, portable medical device, portable lighting device, portable laser device, or any suitable hand-held portable device.

Additionally, various embodiments of the silicon heat-dissipation package, and any variations thereof, may be implemented in a non-portable electronics apparatus. For example, a silicon heat-dissipation package as described herein may be used in a illumination device, lighting instrument, laser device, wireless communication device, telecommunication device, medical device, desktop computer, server, network node such as a router, switch, gateway or the like, etc.

Additional and Alternative Implementation Notes

The above-described embodiments pertain to a technique, design, scheme, device and mechanism related to heat dissipation for compact electronic devices using a silicon package. Although the embodiments have been described in language specific to certain applications, it is to be understood that the appended claims are not necessarily limited to the specific features or applications described herein. Rather, the specific features and applications are disclosed as example forms of implementing such techniques.

In the above description of example implementations, for purposes of explanation, specific numbers, materials configurations, and other details are set forth in order to better explain the invention, as claimed. However, it will be apparent to one skilled in the art that the claimed invention may be practiced using different details than the example ones described herein. In other instances, well-known features are omitted or simplified to clarify the description of the example implementations.

The described embodiments are intended to be primarily examples. The described embodiments are not meant to limit the scope of the appended claims. Rather, the claimed invention might also be embodied and implemented in other ways, in conjunction with other present or future technologies.

Moreover, the word "example" is used herein to mean serving as an example, instance, or illustration. Any aspect or design described herein as "example" is not necessarily to be construed as preferred or advantageous over other aspects or designs. Rather, use of the word example is intended to present concepts and techniques in a concrete fashion. The term "techniques," for instance, may refer to one or more devices, apparatuses, systems, methods, articles of manufacture, and/or computer-readable instructions as indicated by the context described herein.

As used in this application, the term "or" is intended to mean an inclusive "or" rather than an exclusive "or." That is, unless specified otherwise or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more," unless specified otherwise or clear from context to be directed to a singular form.

What is claimed is:

1. A device, comprising:
    a first silicon cover plate having a first primary side and a second primary side opposite the first primary side thereof;
    a second silicon cover plate having a first primary side and a second primary side opposite the first primary side thereof, the first primary side of the second silicon cover plate including an indentation configured to accommodate an electronic device therein, the first primary side of the second silicon cover plate configured to mate with the second primary side of the first silicon cover plate when the first silicon cover plate and the second silicon cover plate are joined together with the electronic device sandwiched therebetween;
    a first silicon heat sink having a first primary side and a second primary side opposite the first primary side thereof, the first primary side of the first silicon heat sink configured to mate with the second primary side of the second silicon cover plate when the first silicon heat sink and the second silicon cover plate are joined together; and
    a second silicon heat sink having a first primary side and a second primary side opposite the first primary side thereof, the second primary side of the second silicon heat sink configured to mate with the first primary side of the first silicon cover plate when the second silicon heat sink and the first silicon cover plate are joined together,
    wherein the second primary side of the first silicon cover plate includes first and second metallic patterns deposited thereon and configured to electrically connect to first and second electrodes of the electronic device, respectively, when the first silicon cover plate and the second silicon cover plate are joined together with the electronic device sandwiched therebetween,
    wherein the second silicon cover plate further includes first and second vias on first and second sides of the indentation, respectively, the first and the second vias filled with an electrically-conductive material and corresponding to the first and the second metallic patterns on the first silicon cover plate to electrically connect to the first and the second metallic patterns, respectively, when the first silicon cover plate and the second silicon cover plate are joined together with the electronic device sandwiched therebetween,
    wherein the first primary side of the first silicon heat sink includes first and second electrodes deposited thereon and corresponding to the first and the second vias of the second silicon cover plate to electrically connect to the electrically-conductive material in the first and the second vias when the first silicon heat sink and the second silicon cover plate are joined together, and
    wherein the second primary side of the second silicon cover plate includes third and fourth metallic patterns deposited thereon and configured to electrically connect to the first and the second electrodes of the first silicon heat sink, respectively, when the first silicon heat sink and the second silicon cover plate are joined together.

2. The device of claim 1, wherein the electronic device is bonded to the second silicon cover plate by thermally-conductive epoxy or solder when the electronic device is accommodated in the indentation of the second silicon cover plate.

3. The device of claim 1, wherein the opening is aligned with the electronic device and exposes at least a portion of the electronic device when the first silicon cover plate and the second silicon cover plate are joined together with the electronic device sandwiched therebetween.

4. The device of claim 1, wherein the first electrode of the first silicon heat sink extends toward a first distal end of the first silicon heat sink and includes one or more first protrusions configured to electrically connect to an external circuit board, and wherein the second electrode of the first silicon heat sink extends toward a second distal end of the first silicon heat sink opposite the first distal end and includes one or more second protrusions configured to electrically connect to the external circuit board.

5. The device of claim 1, wherein either or both that:
the second primary side of the first silicon heat sink includes a plurality of first grooves that form a plurality of first fins on the second primary side of the first silicon heat sink, and
the first primary side of the second silicon heat sink includes a plurality of second grooves that form a plurality of second fins on the first primary side of the second silicon heat sink.

6. The device of claim 1, further comprising:
a collimation element disposed in the opening of the first silicon cover plate and over the electronic device when the first silicon cover plate and the second silicon cover plate are joined together with the electronic device sandwiched therebetween,
wherein the collimation element comprises a lens made of glass, silicone, quartz, or polymer.

7. The device of claim 1, further comprising:
the electronic device accommodated in the indentation of the second silicon cover plate and sandwiched between the first and the second silicon cover plates,
wherein the electronic device comprises a light-emitting diode (LED), a laser diode, a radio frequency (RF) chip, a microwave chip, a photodiode, or a sensor.

* * * * *